(12) United States Patent
Hikmet et al.

(10) Patent No.: US 9,920,908 B2
(45) Date of Patent: Mar. 20, 2018

(54) LIGHTING DEVICE WITH OFF-STATE WHITE APPEARANCE

(75) Inventors: Rifat Ata Mustafa Hikmet, Eindhoven (NL); Ties Van Bommel, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 545 days.

(21) Appl. No.: 13/394,156

(22) PCT Filed: Sep. 10, 2010

(86) PCT No.: PCT/IB2010/054083
§ 371 (c)(1),
(2), (4) Date: Mar. 5, 2012

(87) PCT Pub. No.: WO2011/033431
PCT Pub. Date: Mar. 24, 2011

(65) Prior Publication Data
US 2012/0162964 A1   Jun. 28, 2012

(30) Foreign Application Priority Data
Sep. 17, 2009   (EP) .................................... 09170502

(51) Int. Cl.
*F21V 9/16* (2006.01)
*F21V 14/00* (2018.01)
(Continued)

(52) U.S. Cl.
CPC ............ *F21V 14/003* (2013.01); *F21K 9/233* (2016.08); *F21Y 2115/10* (2016.08); *G02F 1/13718* (2013.01)

(58) Field of Classification Search
CPC ...... F21V 14/003; G02F 1/13718; G02F 1/13; G02F 2201/343
(Continued)

(56) References Cited

U.S. PATENT DOCUMENTS 5,762,823 A * 6/1998 Hikmet .................... 252/299.01
6,147,733 A * 11/2000 Miyamoto et al. ........... 349/112
(Continued)

FOREIGN PATENT DOCUMENTS

DE    102007022090 A1   11/2008
JP        2009021082 A    1/2009
(Continued)

*Primary Examiner* — Alexander Garlen
(74) *Attorney, Agent, or Firm* — Akarsh P. Belagodu

(57) ABSTRACT

A lighting device (400) with an off-state white appearance is provided. The lighting device comprises a light source (403), having a white appearance in an on-state and a colored appearance in an off-state, and a switchable optical element (404) downstream from the light source. The colored appearance of the light source is caused by a photoluminescent material in the light source. The switchable optical element has at least a transmissive state and a state being reflective in the wavelength region in which the light source absorbs light, resulting in a white appearance when the light source is in its off-state and the switchable optical element is in its reflective state. According to an embodiment of the invention, the lighting device (400) is arranged as a luminaire further comprising an optical cavity (401) and a window (402) covering the optical cavity. The light source (403) is arranged inside the optical cavity and the window is provided with the switchable optical element (404).

10 Claims, 2 Drawing Sheets

(51) Int. Cl.
*G02F 1/137*    (2006.01)
*F21K 9/233*    (2016.01)
*F21Y 115/10*   (2016.01)

(58) Field of Classification Search
USPC ............... 362/84, 293, 310, 311.02, 311.03;
349/115
See application file for complete search history.

(56) References Cited

U.S. PATENT DOCUMENTS

| | | |
|---|---|---|
| 6,359,673 B1 | 3/2002 | Stephenson |
| 7,071,907 B1 * | 7/2006 | Duboc et al. .................... 345/87 |
| 7,123,796 B2 * | 10/2006 | Steckl et al. .................... 385/40 |
| 7,301,601 B2 * | 11/2007 | Lin et al. ....................... 349/201 |
| 7,312,560 B2 | 12/2007 | Ouderkirk et al. |
| 7,732,809 B2 * | 6/2010 | Adachi et al. ................... 257/40 |
| 7,845,822 B2 * | 12/2010 | Bierhuizen et al. ........... 362/230 |
| 8,199,083 B2 * | 6/2012 | Fukunaga et al. ............... 345/84 |
| 8,427,605 B2 * | 4/2013 | Boonekamp et al. ........... 349/86 |
| 2004/0116033 A1 | 6/2004 | Ouderkirk et al. |
| 2007/0273265 A1 | 11/2007 | Hikmet |
| 2008/0079015 A1 | 4/2008 | Krummacher |

FOREIGN PATENT DOCUMENTS

| | | |
|---|---|---|
| JP | 2009087762 A | 4/2009 |
| WO | 2007107903 A1 | 9/2007 |
| WO | 2008044171 A2 | 4/2008 |
| WO | 2009066206 A1 | 5/2009 |
| WO | 2009087583 A1 | 7/2009 |
| WO | 2010035171 A2 | 4/2010 |

\* cited by examiner

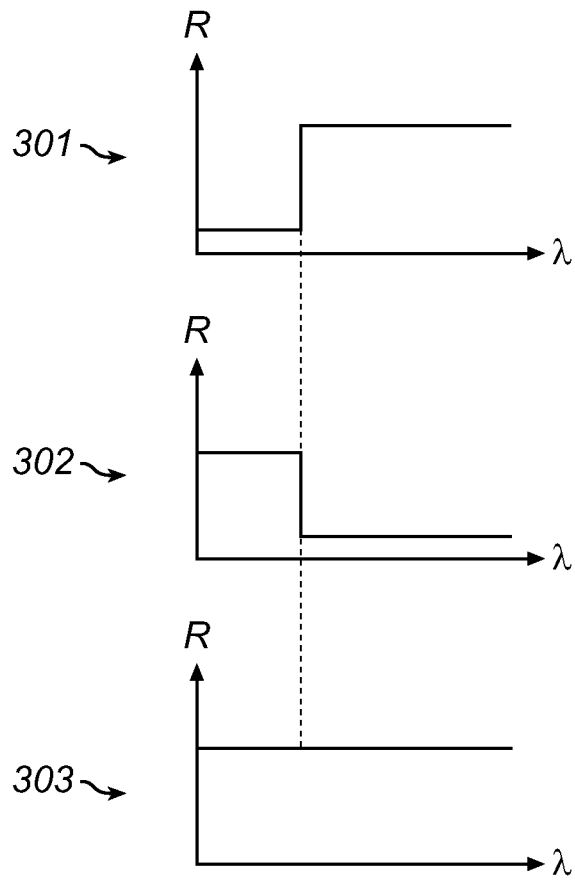
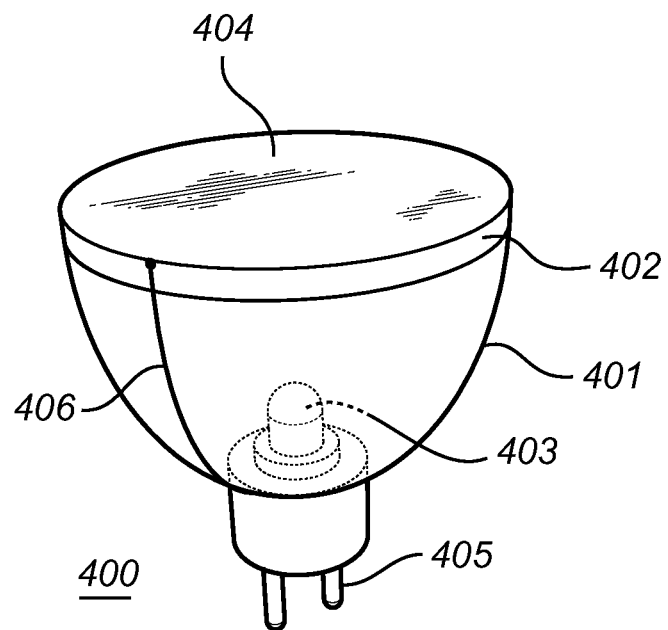
FIG. 3
FIG. 4

LIGHTING DEVICE WITH OFF-STATE WHITE APPEARANCE

FIELD OF THE INVENTION

The invention relates to lighting devices with an off-state white appearance, and more specifically to lighting devices comprising phosphor-based white LEDs.

BACKGROUND OF THE INVENTION

White light emitting diodes (LEDs) are commonly used for illumination or as flash lights, e.g., in mobile phones, digital still cameras, video cameras, or toys.

In one type of white LED, referred to as phosphor converted or phosphor coated LED (pc-LED), yellow emitting phosphor is placed on top of a blue LED to convert a fraction of the blue light to yellow light, which, in combination, renders white light. However, such LEDs exhibit a yellow appearance in their off-state, i.e., when no current is passed through the LED, due to the absorption of blue light by the phosphor. Such a yellow appearance is not desired by the customer.

In order to reduce this yellow appearance, white diffusers can be placed on top of the pc-LED. However, such diffusers reduce the efficiency of the LED, as a fraction of the emitted light is reflected back into the LED where it is absorbed.

The yellow appearance can also be reduced by placing electrically switchable polymer dispersed liquid crystals (PDLCs) on top of the pc-LED. However, the efficiency of a PDLC for hiding the yellow appearance is limited by the PDLC's relatively low back scattering.

WO 2008/044171 A2 discloses a lighting device comprising a pc-LED, the lighting device being configured for providing a residual current to the pc-LED in the functional off-state of the lighting device. The residual current is adjusted such that the pc-LED emits sufficient light to render a white appearance of the lighting device.

SUMMARY OF THE INVENTION

It is an object of the present invention to provide a more efficient alternative to the above techniques and prior art.

More specifically, it is an object of the present invention to provide an improved lighting device with a white appearance in its functional off-state.

These and other objects of the present invention are achieved by means of a lighting device having the features defined in independent claim 1. Embodiments of the invention are characterized by the dependent claims.

For the purpose of describing the invention, the term "white appearance" is used to denote the optical appearance of an entity that either emits white light or exhibits a substantially constant reflectivity spectrum in the visible region, i.e., its reflectivity is not dependent on wavelength. In other words, an entity is considered to have a white appearance if white incident light is reflected as white light.

According to an aspect of the present invention, a lighting device is provided. The lighting device comprises a light source and a switchable optical element. The switchable optical element is located downstream from the light source. The light source has a white appearance in an on-state, i.e., the light source being switched on, and a colored appearance in an off-state, i.e., the light source being switched off. The colored appearance is caused by a photoluminescent material in the light source. The photoluminescent material absorbs light in a first wavelength range and emits light in a second wavelength range. The switchable optical element has at least a transmissive state and a reflective state. The reflective state is reflective in a third wavelength range. The third wavelength range and the first wavelength range overlap substantially as to render a white appearance of the lighting device when the light source is in its off-state and the switchable optical element is in its reflective state.

The present invention makes use of an understanding that the colored appearance of a light source exhibiting photoluminescence can be transformed into a white appearance by configuring the light source with a switchable optical element which, when the light source is in its off-state, exhibits reflection in the wavelength range in which the light source absorbs light. In order to achieve a satisfactory white appearance of the light source, it is sufficient that the region in which the switchable optical element reflects light has a substantial overlap with the wavelength region in which the photoluminescent element absorbs light.

According to an embodiment of the invention, the light source comprises a light emitting element and a photoluminescent element. The light emitting element is capable of emitting light in a fourth wavelength range. The photoluminescent element is located downstream from the light emitting element. The photoluminescent element is capable of absorbing, in the first wavelength range, a fraction of the light emitted by the light emitting element and, in response to absorbing the light, of emitting light in the second wavelength range. The emission of light in the second wavelength range and the emission of light in the fourth wavelength range are arranged to render a white appearance of the light source in its on-state.

According to an embodiment of the invention, the light emitting element is a LED. Using LEDs is advantageous in that they are cheap, robust, and have a low power consumption. The LED may, e.g., be a blue LED, but can, in general, be of any color.

According to another embodiment of the invention, the light emitting element is a laser. Using a laser is advantageous in that it emits light with a high intensity. Further, a tunable laser may be used which allows to adjust the appearance of the lighting device in its on-state. The laser can, e.g., be a semiconductor laser.

According to an embodiment of the invention, the photoluminescent element is phosphor based. The photoluminescent element may, e.g., be based on yellow phosphor. It may also be based on a ceramic phosphor material.

According to an embodiment of the invention, the light source is a white phosphor-coated light emitting diode (pc-LED). Using pc-LEDs is advantageous in that they are cheap and have a low power consumption. Further, pc-LEDs are advantageous in that the light emitting element and the photoluminescent element are contained in a single electronic component which is readily available.

According to an embodiment of the invention, the switchable optical element is electrically switchable. Using an electrically switchable optical element is advantageous in that the switching can be easily effected simultaneously with effecting a change of the functional state of the light source. For example, if the electrically switchable element is in its transmissive state when supplied with an electrical voltage or current, the required voltage or current, respectively, can be supplied by the same power source as the current that is passed through the light source in its on-state. Thus, if a switch is used to turn the light source on or off, the same switch can be used to toggle the switchable optical element between its transmissive and its reflective state. In that way the entire lighting device is switchable between its off-state, having a white appearance, and its on-state, emitting white light, simply by supplying power to the lighting device.

According to an embodiment of the invention, the switchable optical element is a switchable photonic band gap material.

According to an embodiment of the invention, the switchable photonic band gap material is a switchable cholesteric gel. It has been demonstrated that cholesteric gels can be switched between a transmissive state and a reflective state by the application of an electric field. The reflectivity spectrum, i.e., the reflectivity as a function of the wavelength of the incident light, depends on the pitch of the helix of chiral molecules and the mean refractive index of the cholesteric liquid crystal. The pitch can be controlled in different ways, such as by choice of material or by adjusting the conditions, e.g., the temperature, during exposure with ultraviolet light.

According to another embodiment of the invention, the switchable photonic band gap material is based on switchable photonic crystal structures. An example of electrically switchable photonic crystal structures is so called photonic ink (P-ink). Photonic ink is a substance that can change the color of its appearance electronically. It contains particles or structures that are packed in a uniform pattern, such that light of certain wavelengths is deflected by the particles while light of other wavelength is transmitted, resulting in a colored appearance. By applying an electric field, the spacing between particles, i.e., the packing of the particles, can be modified, and the reflectivity characteristics can therefore be adjusted.

According to an embodiment of the invention, the lighting device is arranged as a luminaire, the lighting device further comprising an optical cavity and a window covering the cavity such that light emitted from the cavity passes through the window. The light source is arranged inside the optical cavity. The window is provided with the switchable optical element. The switchable optical element can, e.g., be applied as a coating on either face, or both faces, of the window. Such an arrangement of a retrofit luminaire is advantageous since it allows to use existing luminaires as a starting point, requiring only minor modifications, for manufacturing luminaries with an off-state white appearance.

Further objectives of, features of, and advantages with, the present invention will become apparent when studying the following detailed disclosure, the drawings and the appended claims. Those skilled in the art realize that different features of the present invention can be combined to create embodiments other than those described in the following.

BRIEF DESCRIPTION OF THE DRAWINGS

The above, as well as additional objects, features and advantages of the present invention, will be better understood through the following illustrative and non-limiting detailed description of embodiments of the present invention, with reference to the appended drawings, in which:

FIG. 3 shows an illustration of the reflectivity of a lighting device in accordance with an embodiment of the present invention.

FIG. 4 shows a luminaire in accordance with an embodiment of the present invention.

Figure 1A:
FIG. 1 shows an existing phosphor-based light emitting diode (LED).
Figure 1A:
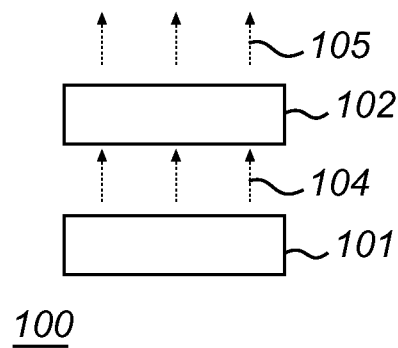

All the figures are schematic, not necessarily to scale, and generally only show parts which are necessary in order to elucidate the invention, wherein other parts may be omitted or merely suggested.

DETAILED DESCRIPTION

FIG. 1 shows, schematically, an existing phosphor-based LED 100. The LED 100 comprises a light emitting element 101, emitting, in its functional on shown in FIG. 1a, blue light 104, and a photoluminescent phosphor-based element 102 downstream from the light emitting element 101. The phosphor-based element 102 absorbs a fraction of the blue light 104 and emits yellow light. Thus, the light 105, downstream from the phosphor-based element 102, is a mixture of blue and yellow light and appears to be white to a viewer 107.

Figure 1B:
Figure 1B:
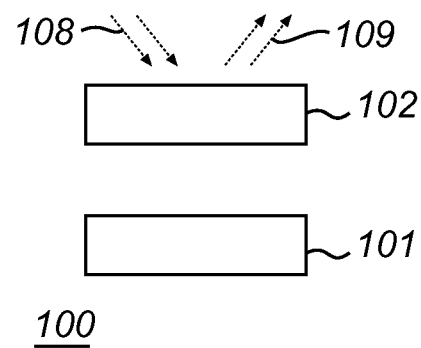

In its functional off-state, shown in FIG. 1b, the light emitting element 101 does not emit light. The phosphor-based element 102, however, absorbs ambient blue light 108, which is converted to yellow light, and reflects light of wavelengths other than blue. Thus, the light 109 is a mixture of reflected light of wavelengths other than blue and emitted yellow light. In other words, the phosphor-based element 102 exhibits a low reflectivity for blue light and a high reflectivity for other wavelengths. This results in a yellow appearance of the LED 100 in its functional off-state.

Even though elements 101 and 102 of lighting device 100 are shown as separate elements in FIG. 1, elements 101 and 102 may be abutting each other. Typically, in existing phosphor-coated LEDs (pc-LEDs), a phosphor coating is applied directly on top of a blue LED.

With reference to FIG. 2, a lighting device 200 in accordance with an embodiment of the invention is described. The lighting device 200 comprises a light emitting element 201, emitting, in its functional on-state shown in FIG. 2a, blue light 204, and a photoluminescent phosphor-based element 202 downstream from the light emitting element 201. The phosphor-based element 202 absorbs a fraction of the blue light 204 and emits yellow light. Thus, the light 205, downstream from the phosphor-based element 202, is a mixture of blue and yellow light. The lighting device 200 further comprises a switchable optical element 203 downstream from the phosphor-based element 202. In the on-state of lighting device 200, the switchable optical element 203 is in its transmissive state. Hence, light 206 downstream from element 203 is a mixture of blue and yellow light and results in a white appearance to a viewer 207.

Figure 2A:
FIG. 2 shows a lighting device in accordance with an embodiment of the present invention.
Figure 2A:
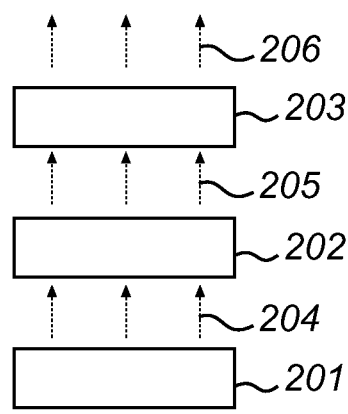
Figure 2B:
Figure 2B:
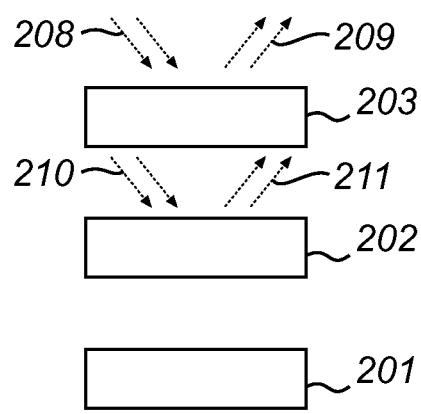

In the functional off-state of device 200, shown in FIG. 2b, the switchable optical element 203 is in its reflective state, reflecting the blue fraction 209 of ambient light 208 to a large extent and transmitting light 210 of wavelengths other than blue. The photoluminescent element 202, in turn, reflects 211 all wavelengths but blue. Thus, the overall appearance of lighting device 200 is white to a viewer 207.

In other words, the white appearance of lighting device 200 in its off-state is achieved by matching the reflectivity of the switchable optical element 203 in its reflective state with the reflectivity of the phosphor-based element 202.

For the purpose of elucidating the invention, schematic reflectivity spectra, i.e., the reflectivity R as a function of the wavelength λ, are shown in FIG. 3. It is important to emphasize that the reflectivity spectra shown in FIG. 3 are schematic only and do not show actual reflectivity spectra. In this respect, the terms "high reflectivity" and "low reflectivity" are used to describe the physical principle of the invention without stating exact values. Further, the reflectivity spectra are limited to the visible spectrum.

With reference to FIG. 3, diagram 301 shows the reflectivity of the phosphor-based element 202, which is low for blue light and high otherwise. The reflectivity 302 of the switchable optical element 203 in its reflective state on the other hand is high for blue light and low otherwise. The total reflectivity 303 of the lighting device, which is the sum of the reflectivity of the light emitting element 301 in its off-state and the reflectivity of the switchable optical element 203 in its reflective state, is high for all wavelengths. In particular, the total reflectivity 303 is constant, i.e., independent of wavelength, resulting in a white appearance of the lighting device 200.

The light emitting element 201 can, e.g., be a LED, an organic LED, or any other light emitting element emitting light of suitable wavelength.

The photoluminescent element 202 can be based on yellow organic or inorganic phosphor, a ceramic phosphor material, or any other photoluminescent material converting light emitted by the light emitting element 201 into light which, in combination with the light emitted by the light emitting element 201, renders white light. Cerium doped YAG and LuAG are frequently used inorganic yellow phosphors for pc-LEDs.

Even though the elements of lighting device 200 are shown as separate parts, some, or all, may be abutting each other, thus creating a compact device. Further, two or more elements may be combined into a single element. For example, in a lighting device according to an embodiment of the invention, the light source can be a pc-LED which can be configured with a switchable optical element. Further, the light emitting element 201, the photoluminescent element 202, and the switchable optical element 203 can be combined into one single element, such as a LED or a luminaire, resulting in a lighting device having a white appearance both in its on-state and in its off-state.

As an example, and with reference to FIG. 4, a retrofit type luminaire 400 is described, in accordance with an embodiment of the invention. The luminaire 400 comprises an optical cavity 401 covered by a window 402. The window 402 is arranged such that light emitted from the cavity 401 passes through the window. The light source 403 is arranged inside the cavity. The window 402 is provided with the switchable optical element 404. The switchable optical element 404 can, e.g., be applied as a coating on one face, or both faces, of window 402. As an alternative, the switchable optical element 404 may also be arranged separate from the window 402, e.g., as an optical filter, either upstream from the window 402, i.e., inside the cavity, or downstream from the window 402. The optical cavity 401 can, e.g., be a collimator such as a reflector, with the light source 403 preferably being arranged in the focal point of the reflector. The luminaire 400 further comprises a connector 405 for electrically connecting the luminaire, in particular the light source 403, to a power supply. The luminaire 400 further comprises an electrical connection 406, such as a wire or a flexible printed circuit board, for electrically connecting the switchable optical element 404 to the connector 405.

Preferably, as described with reference to FIG. 4, the switchable optical element 404 is configured such that it can be electrically switched using the power that is supplied to the luminaire 400 for the purpose of passing current through the light source 403. However, the luminaire 400 may also be provided with an additional electrical connector for the purpose of switching the switchable optical element 404.

Further, the luminaire 400 may further comprise circuitry arranged for electrically switching the switchable optical element 404.

As an alternative to the luminaire described with reference to FIG. 4, a luminaire 400 of retrofit type may also be fitted with a non-white light source 403, e.g., a blue LED. In this case, the photoluminescent element, e.g., phosphor, is arranged separately, and downstream, from the light source 403 and upstream from the switchable optical element 404. The photoluminescent element can, e.g., be applied as a coating on window 402, on one face or both faces, or be arranged as an optical filter inside cavity 401.

The person skilled in the art realizes that the present invention by no means is limited to the embodiments described above. On the contrary, many modifications and variations are possible within the scope of the appended claims. For example, the lighting device may comprise further optical elements, such as diffusers or lenses. Further, the lighting device may comprise more than one light source and/or more than one switchable optical element. For example, multiple light sources and/or multiple switchable optical elements may be used. The different multiple light source and/or multiple switchable optical elements may have different optical characteristics. It will also be appreciated that multiple light source and/or multiple switchable optical elements may be arranged as pixels. Further, the switchable optical element may be pixilated, the different pixels exhibiting different optical characteristics and/or being separately switchable. Multiple light sources may also be arranged as pixels and configured with a common switchable optical element.

In conclusion, a lighting device with an off-state white appearance is provided. The lighting device comprises a light source, having a white appearance in an on-state and a colored appearance in an off-state, and a switchable optical element downstream from the light source. The colored appearance of the light source is caused by a photoluminescent material in the light source. The switchable optical element has at least a transmissive state and a state being reflective in the wavelength region in which the light source absorbs light, resulting in a white appearance when the light source is in its off-state and the switchable optical element is in its reflective state. According to an embodiment of the invention, the lighting device is arranged as a luminaire further comprising an optical cavity and a window covering the optical cavity. The light source is arranged inside the optical cavity and the window is provided with the switchable optical element.

The invention claimed is:

1. A lighting device having a white appearance in both an on-state and an off-state, the lighting device comprising:
    a light source emitting blue light;
    a yellow photoluminescent material downstream from said light source and having a first side facing toward the light source and a second side opposite the first side, the photoluminescent material configured to absorb at said first side some of said blue light emitted by said light source and further configured to emit at said second side yellow light; and
    a switchable optical element downstream from said photoluminescent material and having a first side facing toward the yellow photoluminescent material and a second side opposite the first side, said switchable optical element configured to be switchable between transmissive in the on-state and reflective in the off-state, wherein in the on-state the switchable optical element is transmissive to (i) the yellow light emitted by the photoluminescent material and (ii) blue light emitted by the light source and not absorbed by the photoluminescent material, and further wherein in the off-state the second side of the switchable optical element is configured to reflect a blue wavelength of ambient light but transmit the non-blue wavelengths of the ambient light;

wherein the second side of said photoluminescent material is configured to reflect the wavelengths of the ambient light transmitted through the switchable optical element when said switchable optical element is in the off-state.

2. The lighting device according to claim 1, wherein said light emitting element is a light emitting diode, LED.

3. The lighting device according to claim 1, wherein said light emitting element is a laser.

4. The lighting device according to claim 1, wherein said photoluminescent element is phosphor based.

5. The lighting device according to claim 1, wherein said light source is a white phosphor-coated light emitting diode, pc-LED.

6. The lighting device according to claim 1, wherein said switchable optical element is electrically switchable.

7. The lighting device according to claim 6, wherein said electrically switchable optical element is a switchable photonic band gap material.

8. The lighting device according to claim 7, wherein said switchable photonic band gap material is a switchable cholesteric gel.

9. The lighting device according to claim 7, wherein said switchable photonic band gap material is based on switchable photonic crystal structures.

10. The lighting device according to claim 1, further comprising:
an optical cavity, and
a window covering said optical cavity and enabling light to be emitted from said optical cavity, wherein said light source is arranged inside said optical cavity and wherein said window is provided with said switchable optical element.

* * * * *